US009653392B2

(12) United States Patent
Rivero et al.

(10) Patent No.: US 9,653,392 B2
(45) Date of Patent: May 16, 2017

(54) METALLIC DEVICE HAVING MOBILE ELEMENT IN A CAVITY OF THE BEOL OF AN INTEGRATED CIRCUIT

(71) Applicant: STMicroelectronics (Rousset) SAS, Rousset (FR)

(72) Inventors: Christian Rivero, Rousset (FR); Pascal Fornara, Pourri,ères (FR); Sebastian Orellana, Aix en Provence (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days.

(21) Appl. No.: 14/920,621

(22) Filed: Oct. 22, 2015

(65) Prior Publication Data
US 2016/0293540 A1 Oct. 6, 2016

(30) Foreign Application Priority Data

Mar. 31, 2015 (FR) .................................... 15 52744

(51) Int. Cl.
*H01L 23/522* (2006.01)
*H01L 23/532* (2006.01)
(Continued)

(52) U.S. Cl.
CPC ..... *H01L 23/5222* (2013.01); *H01H 59/0009* (2013.01); *H01L 23/5226* (2013.01);
(Continued)

(58) Field of Classification Search
CPC ........... H01L 2224/16225; H01L 23/48; H01L 21/486; H01L 23/49827; H01L 23/5222; H01L 23/5226; H01L 23/53238; H01L 23/53252; H01L 2924/0002; H01H 59/0009; H01H 50/005; H01H 2061/006; H01H 2001/0052
See application file for complete search history.

(56) References Cited

U.S. PATENT DOCUMENTS 5,880,921 A 3/1999 Tham et al.
6,377,438 B1 4/2002 Deane et al.
(Continued)

FOREIGN PATENT DOCUMENTS

CN 102034648 A 4/2011
CN 103723674 A 4/2014
(Continued)

OTHER PUBLICATIONS

Bouwstra, S., et al., "Thermal Base Drive for Micromechanical Resonators Employing Deep-Diffusion Bases," Sensors and Actuators, vol. 37-38, Jun.-Aug. 1993, pp. 38-44.
(Continued)

*Primary Examiner* — Jasmine Clark
(74) *Attorney, Agent, or Firm* — Slater Matsil, LLP

(57) ABSTRACT

In order, for example, to improve the ohmic contact between two metal pieces located at a metallization level, these two metal pieces are equipped with two offset vias located at the metallization level and at least partially at the via level immediately above. Each offset via comprises, for example, a nonoxidizable or substantially nonoxidizable compound, such as a barrier layer of Ti/TiN.

26 Claims, 10 Drawing Sheets

(51) Int. Cl.
*H01H 59/00* (2006.01)
*H01H 1/00* (2006.01)
*H01H 61/00* (2006.01)

(52) U.S. Cl.
CPC .. *H01L 23/53238* (2013.01); *H01L 23/53252* (2013.01); *H01L 23/53266* (2013.01); *H01H 2001/0052* (2013.01); *H01H 2001/0057* (2013.01); *H01H 2001/0078* (2013.01); *H01H 2061/006* (2013.01)

(56) References Cited

U.S. PATENT DOCUMENTS

| | | |
|---|---|---|
| 6,498,347 B2 | 12/2002 | Sauer et al. |
| 6,646,215 B1 | 11/2003 | Nelson |
| 7,657,995 B2 | 2/2010 | Hsu et al. |
| 7,960,804 B1 | 6/2011 | Ebel et al. |
| 8,264,054 B2 | 9/2012 | Cunningham et al. |
| 8,310,053 B2 | 11/2012 | Verheijden et al. |
| 8,313,970 B2 | 11/2012 | Quevy et al. |
| 8,354,899 B2 | 1/2013 | Keimel et al. |
| 8,564,387 B1 | 10/2013 | Hammond |
| 8,604,898 B2 | 12/2013 | Anderson et al. |
| 8,609,450 B2 | 12/2013 | Gambino et al. |
| 8,610,256 B2 | 12/2013 | Fornara et al. |
| 8,692,247 B2 | 4/2014 | Fornara et al. |
| 8,704,327 B2 | 4/2014 | Rivero et al. |
| 8,741,700 B1 | 6/2014 | Guo et al. |
| 8,884,289 B2 | 11/2014 | Fornara et al. |
| 9,466,452 B1 | 10/2016 | Liu et al. |
| 2005/0146404 A1 | 7/2005 | Yeatman |
| 2005/0189204 A1 | 9/2005 | Yeatman et al. |
| 2006/0145793 A1 | 7/2006 | Ning et al. |
| 2006/0285255 A1 | 12/2006 | Kawakubo et al. |
| 2007/0183116 A1 | 8/2007 | Combi et al. |
| 2007/0262401 A1 | 11/2007 | Yokoyama et al. |
| 2008/0093691 A1 | 4/2008 | Busta |
| 2008/0217149 A1* | 9/2008 | Schmid .............. B81C 1/00246 200/181 |
| 2008/0224241 A1 | 9/2008 | Inaba et al. |
| 2008/0227286 A1 | 9/2008 | Gaillard |
| 2010/0116632 A1 | 5/2010 | Smith et al. |
| 2010/0158072 A1 | 6/2010 | Fornara et al. |
| 2010/0237738 A1 | 9/2010 | Smith et al. |
| 2010/0275904 A1 | 11/2010 | Bathurst et al. |
| 2011/0037132 A1 | 2/2011 | Hsu et al. |
| 2011/0037160 A1 | 2/2011 | Hsu et al. |
| 2011/0051309 A1 | 3/2011 | Furukawa et al. |
| 2011/0063773 A1 | 3/2011 | Ikehashi |
| 2011/0067982 A1 | 3/2011 | Schmit et al. |
| 2012/0009774 A1 | 1/2012 | Fornara et al. |
| 2012/0134121 A1 | 5/2012 | Kanemoto et al. |
| 2012/0280393 A1 | 11/2012 | Kaynak et al. |
| 2012/0306017 A1* | 12/2012 | Edelstein ............ H01L 23/525 257/365 |
| 2013/0146873 A1 | 6/2013 | Fornara et al. |
| 2013/0147004 A1 | 6/2013 | Rivero et al. |
| 2013/0306937 A1 | 11/2013 | Cao et al. |
| 2014/0154851 A1 | 6/2014 | Guo et al. |
| 2014/0167908 A1 | 6/2014 | Fornara et al. |
| 2014/0191385 A1 | 7/2014 | Di-Giacomo |
| 2014/0266562 A1 | 9/2014 | Di-Giacomo et al. |
| 2014/0300249 A1 | 10/2014 | Van Kampen et al. |
| 2014/0319653 A1 | 10/2014 | Fornara et al. |
| 2014/0360851 A1 | 12/2014 | Rivero et al. |
| 2015/0162448 A1* | 6/2015 | Raghavan ........... H01L 29/7869 257/43 |

FOREIGN PATENT DOCUMENTS

| | | |
|---|---|---|
| CN | 205222678 U | 5/2016 |
| EP | 2154635 A1 | 2/2010 |
| EP | 2202767 A1 | 6/2010 |
| EP | 2365498 A1 | 9/2011 |
| FR | 2852441 A1 | 9/2004 |
| FR | 2984009 A1 | 6/2013 |
| FR | 2984010 A1 | 6/2013 |
| JP | 10149950 | 2/1998 |
| JP | 2006238265 A | 9/2006 |
| JP | 2006351296 A | 12/2006 |
| KR | 20110066395 A | 6/2011 |
| WO | 0135433 A2 | 5/2001 |
| WO | 2005069331 A1 | 7/2005 |
| WO | 2013083385 A1 | 6/2013 |

OTHER PUBLICATIONS

Dereus, D.R., et al., "Tunable Capacitor Series/Shunt Design for Integrated Tunable Wireless Front End Applications," MEMS 2011, Cancun, Mexico, Jan. 23-27, 2011, pp. 805-808.

Kaynak, M., et al., "Characterization of an Embedded RF-Mems Switch," IEEE, 2010 Topical Meeting on Silicon Monolithic Integrated Circuits in RF Systems, Jan. 11-13, 2010, pp. 144-147.

Konishi, H., et al., "Built-In Upwards-Bending Electrostatic Actuator Capable of Three-Level-Structural Variable Capacitor," Transducers & Eurosensors '07, The 14th International Conference on Solid-State Sensors, Actuators and Microsystems, Lyon, France, Jun. 10-14, 2007, pp. 447-450.

Liao, K.M. et al., "A Novel Electro-Thermally Driven Bi-Directional Microactuator," 2002 International Symposium on Micromechatronics and Human Science, Oct. 23, 2002, 8 pages.

Parameswaran, M., et al., "CMOS Electrothermal Microactuators," IEEE Proceedings of Micro Electro Mechanical Systems, Feb. 11-14, 1990, pp. 128-131.

Vayrette, R., et al., "Residual Stress Estimation in Damascene Copper Interconnects Using Embedded Sensors," Microelectronic Engineering, vol. 87, Issue 3, Mar. 2010, pp. 412-415.

* cited by examiner

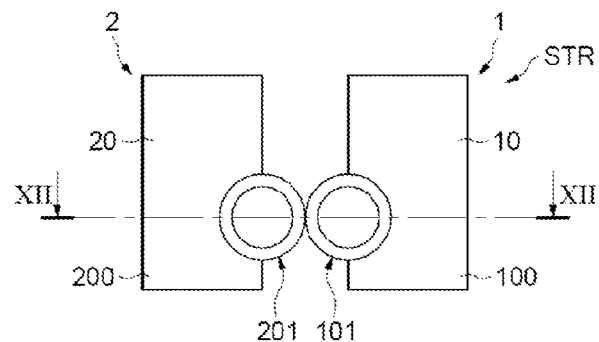
FIG.11
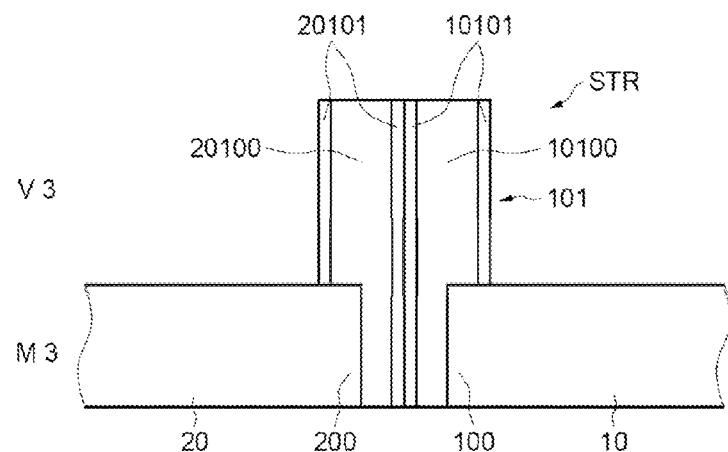
FIG.12
FIG.13
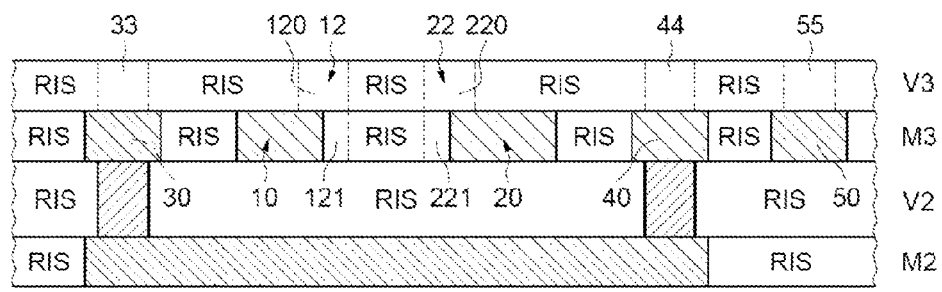

METALLIC DEVICE HAVING MOBILE ELEMENT IN A CAVITY OF THE BEOL OF AN INTEGRATED CIRCUIT

This application claims priority to French Application No. 1552744, filed on Mar. 31, 2015, which application is hereby incorporated herein by reference.

TECHNICAL FIELD

Embodiments of the invention relate to metallic device having mobile element in a cavity of the BEOL of an integrated circuit.

BACKGROUND

Devices housed in cavities of the interconnection parts (BEOL) of integrated circuits and having at least one mobile metal piece are known. They may, for example, form switches which are used to establish or interrupt electrical connections, or alternatively may form capacitors having thermally variable capacitive values.

Such devices are described, for example, in published Patent Applications FR 2984009, FR 2984010, and WO 2013/083385. These foreign applications correspond to U.S. Pat. No. 8,884,289, U.S. Pat. No. 8,704,327, and U.S. Patent Appl. Pub. No. 2014/0266562.

Although these devices are entirely satisfactory, in certain cases it may occur that the metal pieces mobile relative to one another become oxidized at the surface in contact with the air present in the cavity.

The result of this, when the device is used as a switch, is then a reduction in the quality of the ohmic contact between these metal pieces, which may in the worst case lead to the establishment of an electrical connection passing through these metal parts being prevented.

When the device is used in order to form a capacitor with a variable capacitive value, the formation of a metal oxide on the surface of these pieces next to one another may create an additional dielectric, which will modify the expected value of the capacitive value of the capacitor for a given distance between these metal pieces.

One embodiment proposes to avoid as far as possible the degradation of an ohmic contact or the formation of an additional dielectric at pieces, mobile relative to one another, of a device accommodated in a cavity, and to do so while remaining compatible with CMOS technologies and with a reduced extra volume cost.

SUMMARY

Embodiments of the invention relate to integrated circuits, in particular, configurable devices housed in housings or cavities located in the interconnection parts commonly referred to by the person skilled in the art by the acronym BEOL ("Back End Of Line"), and more particularly the ohmic contacts between pieces, mobile relative to one another, belonging to such devices.

One embodiment proposes to use the operation of etching the vias of the via level immediately above the metallization level containing the pieces mobile relative to one another in order to produce in the intermetal dielectric (IMD), simultaneously with the orifices intended subsequently to form the vias, additional orifices whose apertures overlap the mobile pieces.

The etching of the orifices intended to form the vias is conventionally etching whose duration is intentionally selected to be long enough to make it possible to correctly open the vias over the entire wafer, including at the periphery of the latter.

For this reason, since the apertures of the additional orifices overlap the mobile pieces, the etching will hollow not only the intermetal dielectric located on the via level but also at least partially that located around the metallization level, laterally with respect to the metal pieces.

Furthermore, once filled with at least one electrically conductive material, these additional orifices will form offset vias, that is to say projecting parts, facing one another.

In a first variant, which makes it possible to obviate an additional metallization level, only a part of the intermetal dielectric may be etched in order to produce the offset vias, whereas the other vias of via levels are then produced in two steps (deposition of two successive layers of intermetal dielectric).

Furthermore, by using a filling material resistant to the formation of an electrically insulating compound at the surface in contact with the fluid present in the cavity, for example an electrically insulating oxide, the degradation of an ohmic contact or the formation of an additional dielectric at the pieces, mobile relative to one another, of a device housed in the cavity is avoided as far as possible, while remaining compatible with CMOS technologies and with a reduced extra cost in terms of volume.

One aspect provides an integrated circuit, comprising, above a substrate, an interconnection part having, within an insulating region, a plurality of metallization levels separated by via levels. As indicated above, such an interconnection part is commonly referred to by a person skilled in the art by the acronym "BEOL".

The integrated circuit furthermore comprises, within the interconnection part, a device having, in a housing (or cavity) filled with a fluid, generally air, two metal parts both located within the same metallization level and mobile relative to one another parallel to the substrate (one of the pieces may be fixed and the other mobile, or both may be mobile).

According to one general characteristic of this aspect, the device furthermore comprises two electrically conductive appendages respectively secured to the two metal parts, each appendage being located on the one hand at least partially at the same metallization level and on the other hand at least partially at the via level immediately above. Each appendage has a projecting part facing towards the projecting part of the other appendage. Each projecting part comprises at least one electrically conductive compound resistant (or refractory) to the formation of an electrically insulating compound at the surface in contact with the fluid present in the housing.

A compound resistant or refractory to surface formation in contact with the fluid present in the housing is, for example, a compound which does not form an electrically insulating compound, or which will form one at the end of an extremely long time typically longer than the lifetime of the integrated circuit, specifically at the operating temperature of the integrated circuit, typically below 150° C.

There are numerous possibilities for selecting such a compound.

For example, this compound may be selected from ceramics, for example titanium, tantalum, tungsten or ruthenium.

It should be noted here that ruthenium, even though it oxidizes, forms a ruthenium oxide which is itself electrically conductive.

This being the case, in practice, the compound may be a compound resistant to oxidation, for example a compound which is substantially nonoxidizable in contact with the air present in the housing at a temperature below 150° C.

By way of example, the compound may be selected from the group formed by titanium, titanium nitride, tantalum, tantalum nitride, tungsten, ruthenium, gold and a combination of at least some of these various elements.

This being the case, in practice, the composition of the appendages (offset vias) is advantageously identical to that of the vias.

Thus, according to one embodiment, when the metallization levels comprise aluminum, each appendage comprises tungsten coated with a barrier layer comprising titanium and titanium nitride. Furthermore, it is this barrier layer, resistant to the formation of an electrically insulating compound, which will ensure the ohmic contact, for example, between the two parts mobile relative to one another.

As a variant, when the metallization levels comprise copper, each appendage may then comprise copper coated with a barrier layer comprising tantalum and tantalum nitride.

According to one embodiment, the device has a configurable structure housed at least partially in the housing, incorporating the two metal parts and having a first configuration in which the two appendages are in contact so as to allow an electrical connection passing through the two appendages and the two metal parts, and a second configuration in which the two appendages are at a distance from one another so as to prevent the electrical connection.

In other words, the device behaves in this case as an integrated electrical device for mechanical switching.

As a variant, the device may have a configurable structure housed at least partially in the housing, incorporating the two metal parts and having at least a first configuration in which the two appendages are at a first distance from one another so as to form a first capacitor having a first capacitive value, and a second configuration in which the two appendages are at a second distance from one another so as to form a second capacitor having a second capacitive value.

In other words, the device behaves in this case as an integrated capacitive device having a variable, for example thermally variable, capacitive value.

The structure may be thermally activatable.

As a variant, the structure may comprise a first metal element incorporating one of the two parts, a second metal element incorporating the other part, and a third element lying next to the first element, the first element and the third element respectively having two additional electrically conductive projecting appendages having a composition identical to that of the appendages lying next to one another, and the device furthermore includes activation means configured in order to make the structure change from one configuration to another under the effect of an electrostatic force exerted between the two additional projecting appendages.

Thus, the provision of the electrically conductive additional projecting appendages makes it possible to reduce the space between the first element and the third element, which makes it possible to activate the structure with an electrostatic force less than that which it would have been necessary to exert in the absence of these additional projecting appendages.

BRIEF DESCRIPTION OF THE DRAWINGS

Other advantages and characteristics of the invention will become apparent on studying the detailed description of entirely nonlimiting embodiments, and the appended drawings, in which:

FIGS. 6 to 22 relate to various embodiments of the invention.

DETAILED DESCRIPTION OF ILLUSTRATIVE EMBODIMENTS

Although the invention applies to any device having two pieces mobile relative to one another parallel to the substrate, the invention applies more particularly to integrated electrical devices for mechanical switching or to capacitive devices having a variable, for example thermally variable, capacitive value, for example those described in the aforementioned published patent applications.

One example of an integrated switching device is described in Patent Application Publication FR 2 984 009 (and counterpart U.S. Pat. No. 8,692,247).

The main characteristics thereof will be recalled here with reference to FIGS. 1 to 5.

Figure 1:
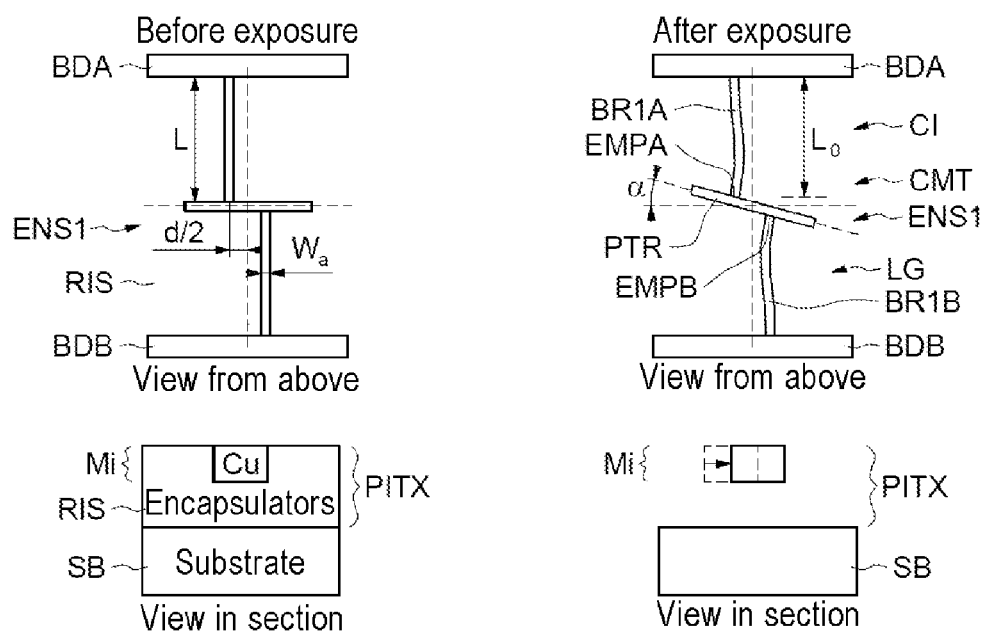
FIGS. 1 to 5 relate to the prior art.

Referring to FIG. 1, it can be seen that the mechanical switching device or switch CMT is produced within a single metallization level Mi of the interconnection part PITX of the integrated circuit CI, this interconnection part also being commonly referred to by a person skilled in the art by the acronym "BEOL".

This interconnection part PITX may also be referred to as an interconnection region PITX and is located above the substrate SB.

In the examples described here, the switch CMT is made of metal, more particularly aluminum. This being the case, the metal could be copper, without these two examples implying limitation.

The switch CMT in this case comprises an assembly or structure ENS1 in the shape of an asymmetric cross. This assembly ENS1 has a first branch BR1A, and a second branch BR1B secured to a beam PTR, also referred to as a "central pointer", at two positions EMPA and EMPB respectively located on two opposite faces of the beam PTR. These two locations EMPA and EMPB are separated by a distance d.

As will be seen in more detail below, the assembly ENS1 is produced by using conventional techniques for producing the metal tracks of the interconnection part PITX, which are used particularly in CMOS technology.

The left-hand part of FIG. 1 shows the switch CMT, and more particularly the assembly ENS1 encapsulated in an insulating region RIS, whereas the right-hand part of FIG. 1 shows the same assembly after etching of the insulating region so as to expose the branches BR1A and BR1B as well as the beam PTR.

The assembly ENS1 exposed in this way therefore extends inside a housing LG resulting from the removal of the insulating region RIS, the two branches BR1A and BR1B being secured to the edges BDA and BDB of the housing.

It has been shown in the article by R. Vayrette et al. entitled: "Residual stress estimation in damascene copper interconnects using embedded sensors", Microelectronics Engineering 87 (2010) 412-415, that, after de-encapsulation of an assembly of this type, there is relaxation of stresses which causes a residual longitudinal deformation of the branches, leading to a deviation a of the pointer, here in the clockwise direction.

Depending on the applications which will be envisaged, and in particular the desired precision, for example in the case of temperature detection, this residual deviation a of the pointer PTR could be taken into account or neglected.

Figure 2:
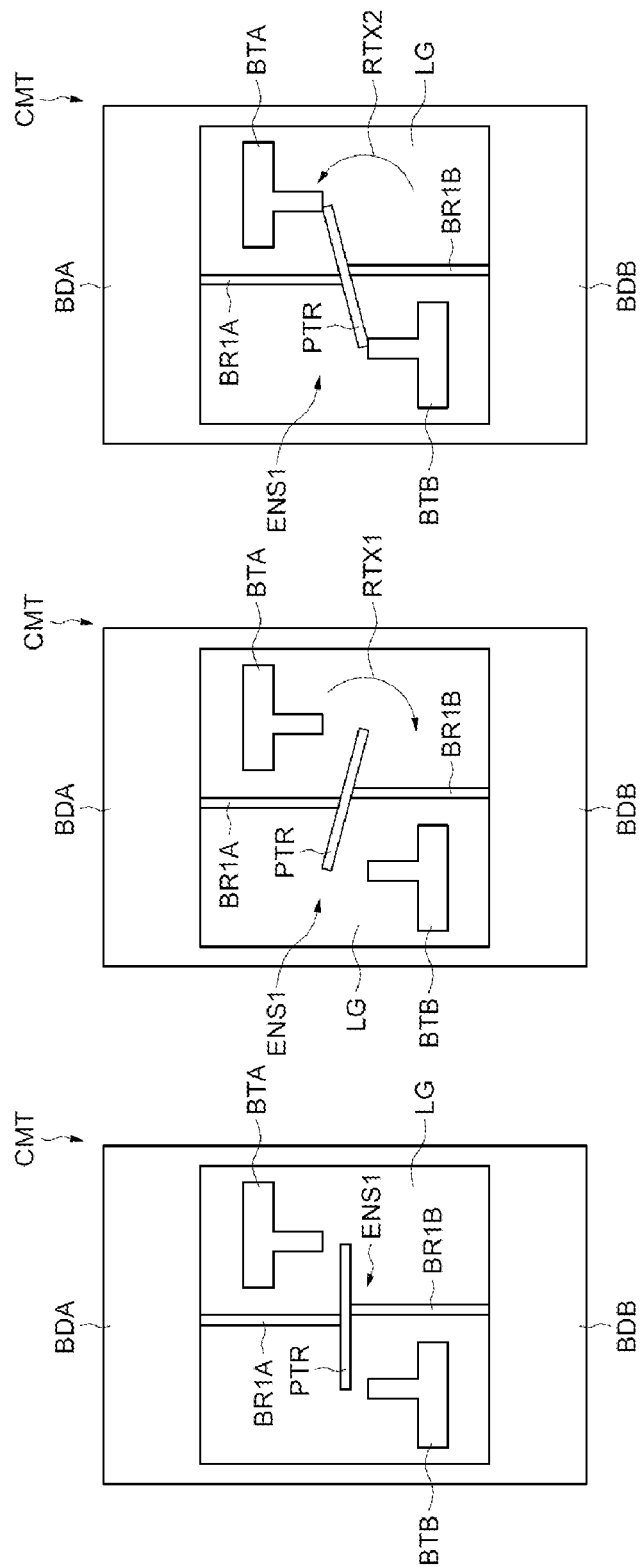

In the example illustrated in FIG. 2, the switch CMT comprises, in addition to the assembly ENS1, two electrically conductive stops BTA and BTB, for example two metal stops, also produced within the same metallization level as that in which the assembly ENS1 was produced.

The left-hand part of FIG. 2 represents the assembly ENS1 before de-encapsulation of the insulating region RIS, and the central part of FIG. 2 represents the same assembly ENS1 once de-encapsulated, that is to say exposed from the insulating region RIS. In the example shown here, the residual deviation of the beam PTR (pointer), associated with the relaxation of the stresses during the exposure of the assembly ENS1 from the insulating region RIS which surrounded it, is taken into account.

In the central part of FIG. 2, the first assembly ENS1 then has a first configuration when it is at a first temperature, for example ambient temperature. In this first configuration, the beam is at a distance from the two stops BTA and BTB and no electrical connection can pass through these stops BTA and BTB and the beam PTR.

In the right-hand part of FIG. 2, the ENS1 assembly has been thermally activated in order to adopt a second configuration, in which the beam PTR comes in contact with the two stops BTA and BTB.

This thermal activation is caused by a rise in the temperature of the expansion branches BR1A and BR1B.

Specifically, because of the rise in temperature, these branches expand and, since the two fastening points of the two branches BR1A and BR1B on the beam PTR are spaced apart in the longitudinal direction of the beam, this expansion causes a nonzero moment of force, resulting in a rotation RTX2 of the beam PTR in the anticlockwise direction and parallel to the substrate, this rotation RTX2 being opposite to the rotation RTX1 (central part of FIG. 2) resulting from the relaxation of stresses on the assembly ENS1.

Knowing the thermal expansion coefficient of the material forming the expansion branches, the geometry of the branches, in particular their length and their width as well as their thickness, and the spacing d between the two fastening points, the deviation of the pointer PTR resulting from the rotation RTX2 can be simulated easily.

The stops BTA and BTB can consequently be positioned in the housing in such a way that, above a threshold temperature, the beam PTR comes in contact with these two stops BTA and BTB.

It then becomes possible to establish an electrical connection passing through the stops BTA, BTB and through the beam PTR.

Figure 3:
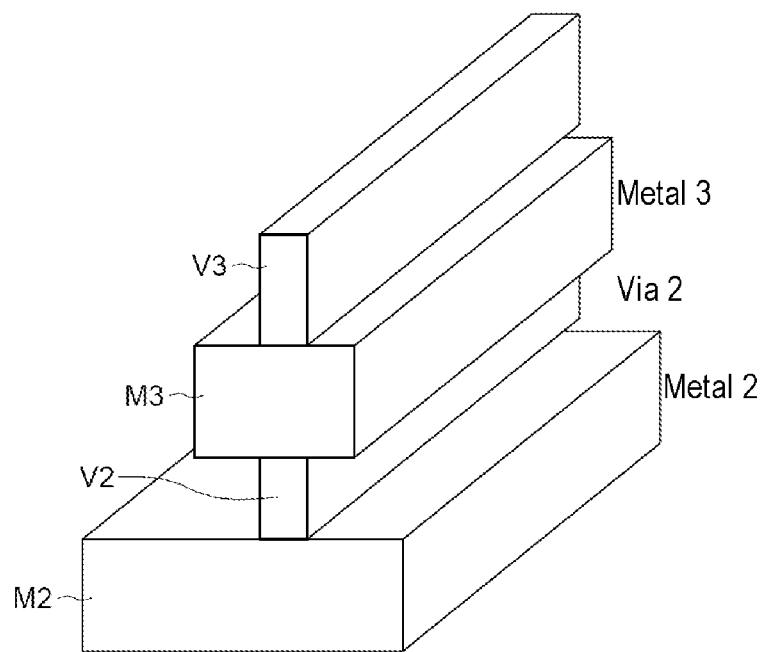

Reference will now be made more particularly to the FIGS. 3 to 5, in order to illustrate a way of fabricating an exemplary embodiment of the switch CMT.

It is assumed in these figures that the assembly ENS1, as well as the stops BTA and BTB, are produced at the metallization level M3 (also referred to as Metal level M3).

It is then seen (e.g. in FIG. 3) that the level V2 of vias 2 between the metal level 2 and the metal level M3 and the level V3 of vias 3 between the metal level M3 and the metal level M4 are used in order to form a "protective" wall for the subsequent oxide etching and in order to make it possible to de-encapsulate the assembly ENS1 and the various stops.

Figure 4:
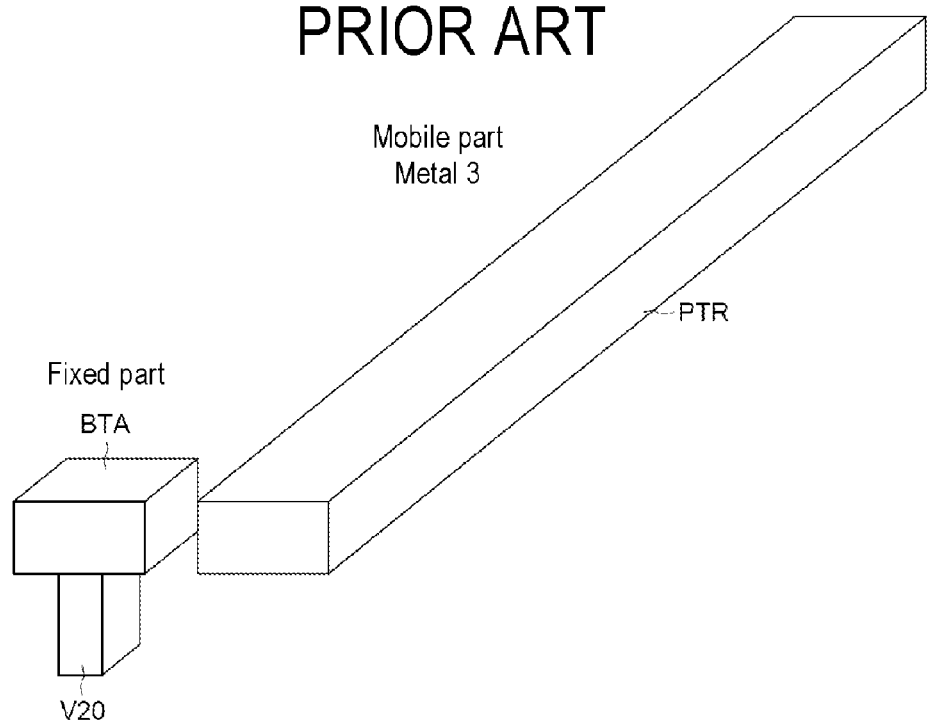
Figure 5:
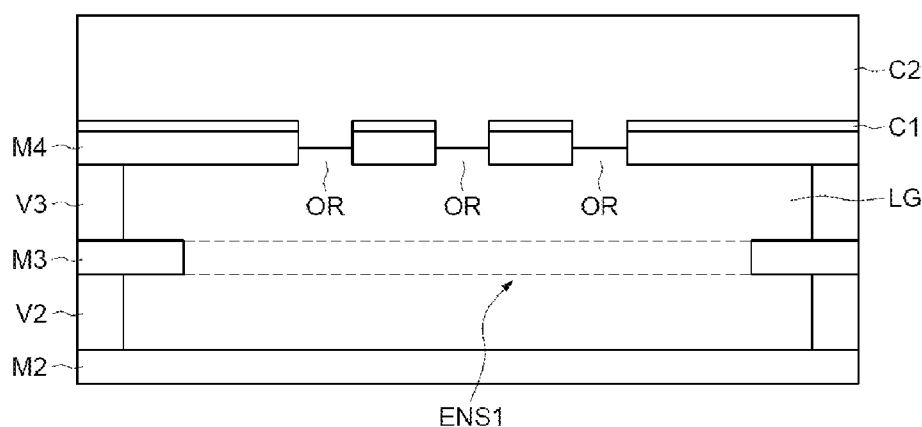

Furthermore, as illustrated in FIG. 4 both the mobile part of the switch CMT, in this case the beam PTR, and the fixed part, in this case the stop BTA, are produced at the metal level M3. Furthermore, the stop BTA is connected to the metal level M2 by a via V20.

The switch CMT, and in particular the assembly ENS1, are produced by using conventional steps of fabricating metallization and via levels. More precisely, as illustrated in FIG. 5, after the production of the metal level M2 and of the via level V2, the assembly ENS1, represented here by dashes for the sake of simplicity, is produced in a conventional way by etching the underlying oxide and depositing metal, in this case copper, in the trenches. The assembly is then covered with oxide and the metallization level M4 is then produced.

After the formation of a conventional nitride layer C1 on the metal level M4, a comb is produced in this metal level M4 so as to form orifices OR.

Dry isotropic etching is then carried out, followed by wet etching, for example with hydrofluoric acid, so as to remove the insulating region (oxide) encapsulating the assembly ENS1, as well as the various stops, and thereby to produce the housing LG.

Nonconformal oxide deposition is then carried out in order to form a layer C2 closing the orifices OR.

Of course, that which has just been described for the metal levels M2, M3, M4 may be generalized to the metal levels $M_{i-1}$, $M_i$, $M_{i+1}$.

The conventional method for producing the various upper metallization levels then continues.

So as to avoid the possible appearance of an oxide on the surface of the two metal pieces mobile relative to one another, for example the beam PTR and the stops BTA and BTB of the prior art device described, provision is generally made to equip two metal parts, mobile relative to one another, with two projecting appendages each comprising at least one electrically conductive compound resistant to the surface formation of an electrically insulating compound in contact with the fluid present in the housing.

This is illustrated schematically in FIGS. 6 to 20.

Figure 6:
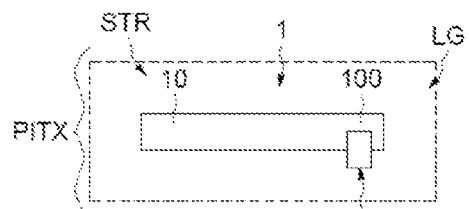

In FIG. 6, the reference 1 denotes an element, fixed or mobile parallel to the substrate of the integrated circuit, of a structure STR housed at least partially in the housing LG of the BEOL part PITX, comprising in this example a branch 10 whose end 100 is intended to be mobile relative to another end of another element.

It can be seen in this example that the element 1 comprises an appendage 101 secured to the end 100 and projecting from this end 100.

Figure 7:
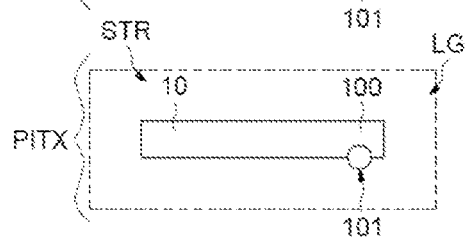

FIG. 6 is a schematic view of the "layout" type, whereas FIG. 7 schematically illustrates the geometrical configuration of the appendage 101 once produced.

Figure 8:
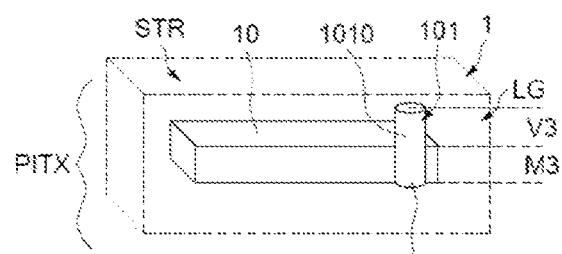

FIG. 8 is a perspective view of the element 1.

It can be seen that this appendage 101 comprises an upper part 1010 located at the via level immediately above the metallization level comprising the metal part in movement, and a lower part 1011 extending at least partially, and generally entirely, to the metallization level.

If it is assumed, for example, that this element 1 is the beam PTR (e.g. metal beam) of the device described with reference to FIGS. 1 to 5, which is produced at the metallization level M3, then the upper part 1010 of the appendage 101 is located at the via level V3 whereas the lower part 1011 of the appendage 101 is located at the metallization level M3.

The formation of this appendage 101, which is in fact an offset via, will be returned to in more detail below in order to explain the arrangement of these two upper and lower parts 1010 and 1011.

Specifically, as will be seen in more detail below, this appendage 101 will be produced simultaneously with the vias of the via level V3.

Thus, even though, as indicated above, there are numerous possibilities for selecting the compound(s) forming this appendage 101, it is particularly advantageous for the appendage 101 to have a composition identical to that of the vias of the integrated circuit.

Furthermore, by way of example, when the metallization levels are made of aluminum, the vias generally comprise tungsten coated with a barrier layer comprising titanium and titanium nitride.

Figure 9:
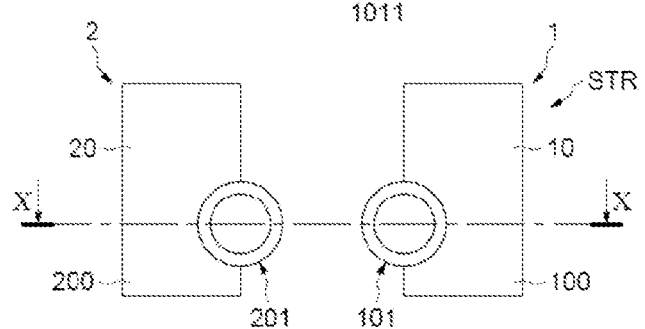
Figure 10:
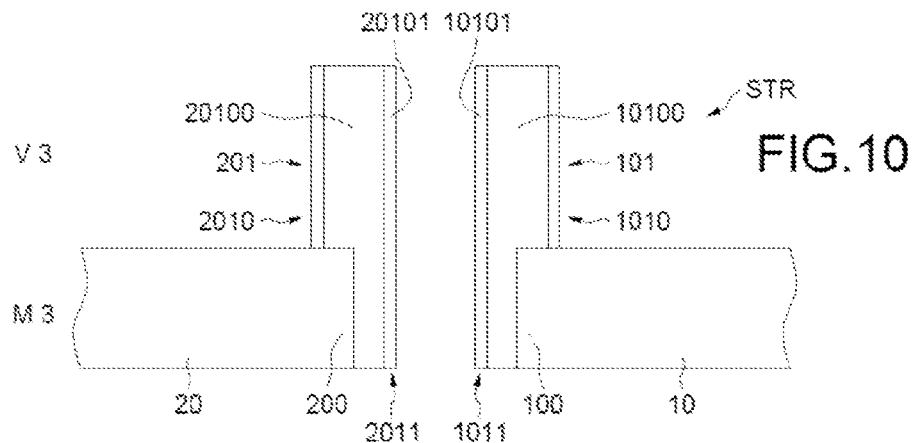

This is illustrated more precisely in FIGS. 10 and 12, which are respectively sections along the lines X-X and XII-XII of FIGS. 9 and 11.

FIG. 9 represents two elements 1 and 2 of the structure STR, each having, respectively, the ends 100 and 200 which are mobile relative to one another. Each of the two ends 100 and 200 could be mobile, or alternatively one of the two ends 100 and 200 may be fixed whereas the other is mobile. This is the case, for example, for the beam PTR and the stops BTA and BTB of the device of FIGS. 1 to 5.

Each end 100 and 200 is respectively equipped with an appendage 101, 201.

In the configuration illustrated in FIG. 9, the two appendages 101 and 201, facing one another, are spaced apart so as to prevent any electrical connection from passing through the elements 1 and 2.

It can be seen in FIG. 10 that the central part 10100, 20100 of each appendage 101 and 201 is formed by tungsten coated laterally with the barrier layer 10101, 20101. By way of indication, the barrier layer comprises a 50 angstrom layer of titanium and a 50 angstrom layer of titanium nitride TIN, the titanium nitride layer being in contact with the tungsten.

In FIG. 11, the two appendages 201 and 101 are in ohmic contact, allowing an electrical connection to pass through the metal elements 1 and 2.

It can be seen in FIG. 12 that it is in fact the two barrier layers 10101 and 20101 which are in contact, which improves the quality of the ohmic contact and avoids degradation thereof over the course of time, since the barrier layer formed by titanium and titanium nitride will not form on the surface an electrically insulating material in contact with the air present in the cavity and at the usual operating temperatures of the integrated circuit. Furthermore, the use of the appendages 101 and 201 in order to produce the electrical contact makes it possible to increase the contact area in comparison with a conventional configuration (without offset vias), and therefore to reduce the electrical contact resistance.

Reference will now be made more particularly to FIG. 13 in order to illustrate an embodiment of a method for producing the projecting appendages.

As explained above, particularly with reference to FIGS. 3 to 5, after having produced the bottom wall of the housing at the metallization level M2, then the via level V2 comprising the corresponding portions of lateral walls of the housing, a layer of aluminum (for example), intended to form the various metal tracks and elements of the device located at the metallization level M3, is deposited on the via level V2 and on the insulating region RIS enclosing the vias of the via level V2.

Once this deposition of aluminum has been carried out, this layer is etched so as to form the elements 30 and 40 of lateral walls of the housing, the branches 10 and 20 of the two elements 1 and 2 intended to be relatively mobile relative to one another, as well as, outside the housing LG, metal tracks 50 of the integrated circuit.

Oxide deposition is then carried out again in order to continue to form the insulating region RIS. After chemical-mechanical polishing has been carried out, etching of the vias of the via level V3 is carried out. This etching is conventionally plasma etching and makes it possible to produce, in the insulating region RIS, the orifices 33, 44 and 55 which will be intended to form, after filling with the filling material of the vias, other parts of lateral walls of the housing LG as well as, as regards the orifice 55, a via intended to connect the metal track 50 of the metal level M3 to a metal track located at a higher metallization level.

This etching also makes it possible to produce two orifices 12 and 22, which are orifices offset in relation to the branches 10 and 20.

The etching conventionally has a duration long enough to be able to correctly open the orifices 12 and 22 intended to receive the vias over the entire semiconductor wafer assembly, particularly at the ends of the latter.

For this reason, as regards the orifices 12 and 22, the etching operation will first open the upper parts 120 and 220 of these orifices 12 and 22 then, since these orifices are offset, make it possible to open the lower parts 121 and 221 of these orifices 12 and 22, which are located at least partially, and in general entirely, at the metallization level M3.

The vias are then filled by conformal deposition of the Ti/TiN barrier layer then by deposition of tungsten, conventionally by chemical vapour deposition (CVD deposition). It should be noted in this regard that this deposition is advantageously preceded by plasma etching ("soft sputter etch"), which makes it possible to remove the native oxide on the aluminum so that the titanium is in direct contact with the aluminum. This is possible because there is no re-entry of air between the etching chamber and the titanium deposition chamber. The method here is a vacuum method, which advantageously makes it possible to ensure good electrical contact between the barrier layer and the aluminum.

After chemical-mechanical polishing has been carried out, all the vias of the via level V3 are produced, as well as the appendages 101 and 201 which fill the orifices 12 and 22.

In this embodiment, the formation of the appendages 101 and 201 will require an additional via level and metallization level in order to close the housing, which represents an albeit reduced extra cost in terms of volume.

Figure 14:
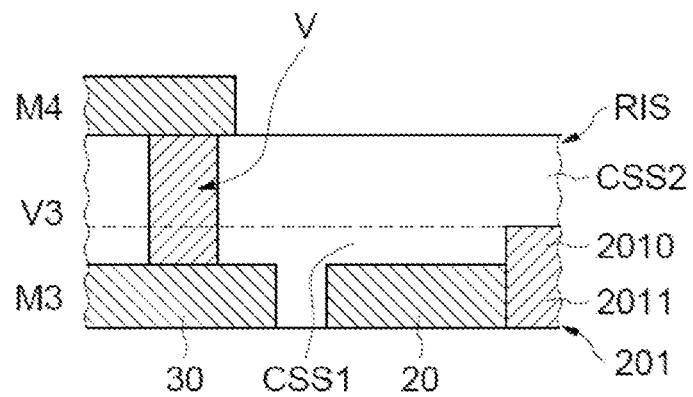

As a variant, it would be possible to avoid forming these additional via and metallization levels by forming, as illustrated schematically in FIG. 14, appendages 201 extending partially or entirely to the metal level $M_i$ (for example the level M3) and extending only partly to the via level $V_i$ immediately above (for example the level V3), and by producing the other vias in two steps.

More precisely, an insulating layer CSS1 thinner than the future insulating region RIS intended to separate the adjacent metallization levels M3 and M4 is first deposited on the metal level M3.

The appendage 201 secured to the branch 20 is then produced in a manner similar to that described above.

Since the thickness of the layer CSS1 is less than the distance between metallization levels, the upper part 2010 of the appendage 201 extends only partly to the via level V3, whereas the lower part 2011 of this appendage 201 in this case extends fully to the metallization level M3.

A complementary insulating layer CSS2 is then redeposited so as to form the insulating region RIS. It is in this region RIS that the other vias V of the via level V3 will then be produced.

The geometry of the appendages 101 and 201 may be arbitrary, and is not limited to the shape illustrated in FIGS. 6 to 12.

Figure 15:
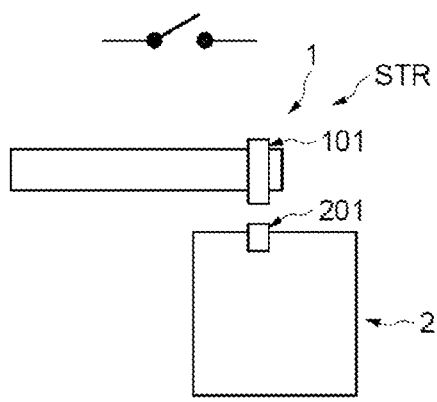
Figure 16:
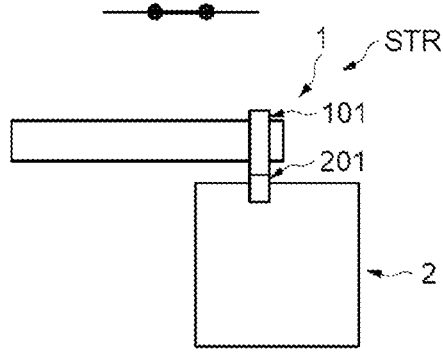

Thus, as illustrated in FIGS. 15 and 16, the appendage 101 may be located in the vicinity of the end of the element 1 (which may be mobile relative to element 2) and fully overlap this element 1 transversely.

Likewise, the element 2, which may for example be fixed relative to element 1, is then provided on one of its sides with an appendage 201.

In FIG. 15, the two appendages 101 and 201 are at a distance from one another, corresponding to an open switch, whereas in FIG. 16 the two appendages 101 and 201 are in ohmic contact, corresponding to a closed switch.

Figure 17:
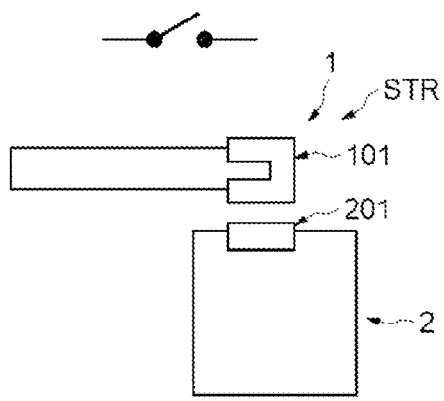
Figure 18:
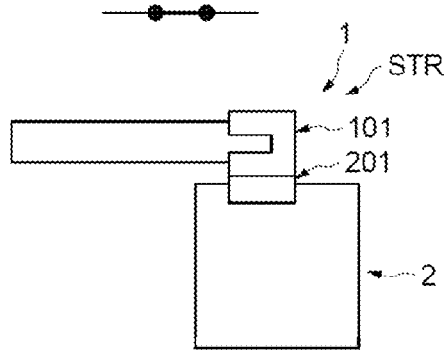

In FIGS. 17 and 18, which also represent a switch in its open and closed states, the appendage 101 may fully cover the free end of the element 1, which is assumed to be the mobile element relative to element 2, so as to have a part next to the appendage 201 of the element 2.

The change from a configuration of the open switch type to a configuration of the closed switch type may be due to a thermal activation obtained, for example, by deformation of at least one of the elements, due for example to a rise in temperature of the integrated circuit. This is described for example, in the aforementioned French patent application, or in Patent Application WO 2013/083385 (US2014/266562).

As a variant, this rise in temperature may be obtained by the Joule effect by flow of a current in at least one of the metal elements.

Figure 19:
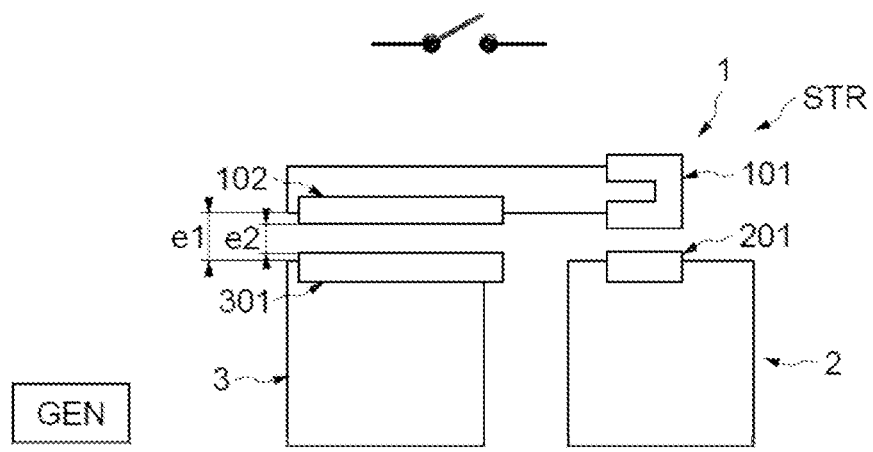
Figure 20:
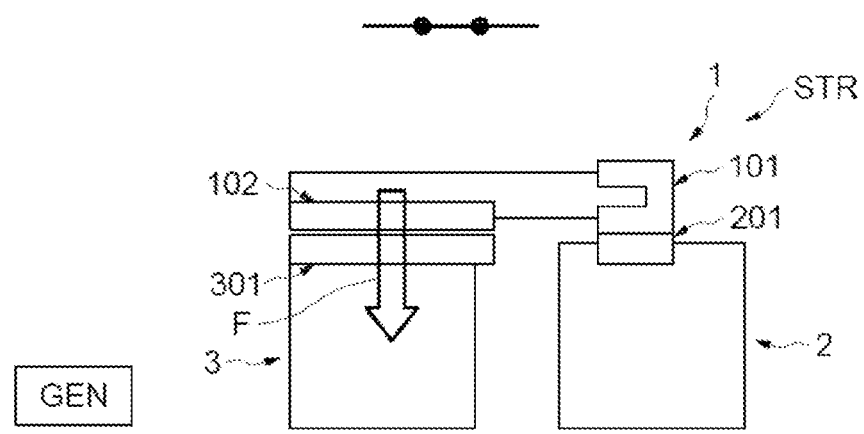

As a variant, as illustrated in FIGS. 19 and 20, it is possible for this activation to be obtained by the application of an electrostatic force F generated by activation means known per se. These activation means may, for example, comprise a generator GEN capable of applying a potential difference between the two appendages 102 and 301.

More precisely, in this case, as illustrated in FIG. 19, the structure STR comprises a first element 1, which is assumed to be a mobile element, equipped at its end with a projecting appendage 101 located next to the projecting appendage 201 of a second element 2, which is assumed to be fixed. The switch is then in an open state.

Furthermore, a third element 3 is also equipped with an additional projecting appendage 301, which is located next to an additional projecting appendage 102 of the first element 1.

In view of the projecting nature of the additional appendages, the distance e2 between these appendages is less than the distance e1 which would separate the elements 1 and 3 in the absence of additional appendages 102 and 301.

As illustrated schematically in FIG. 20, by application of an electrostatic force F between the additional appendages 102 and 301, the appendage 101 comes in contact with the appendage 201 in order to place the switch in its closed state.

Furthermore, in view of the fact that the distance e2 is less than the distance e1, and the area of the activation capacity is greater because of the presence of the additional appendages, the electrostatic force F necessary in order to place the appendages 101 and 201 in contact is less than the electrostatic force which it would have been necessary to apply between the elements 3 and 1 in the absence of additional appendages 301 and 102. The decrease in the activation voltage, associated with the gain in area, may for example reach a factor of 2.

The invention does not only apply to integrated mechanical switches, but may also find an application for integrated capacitive devices having a variable, for example thermally variable, capacitive value, such as for example that described in published French Patent Application FR 2 984 010.

Figure 21:
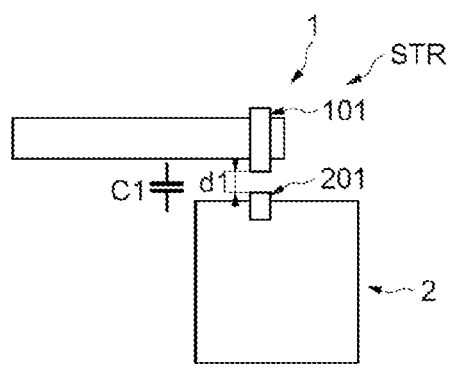

Specifically, as illustrated in FIG. 21, the metal structure STR, comprising the two metal elements 1 and 2 equipped with their respective appendages 101 and 201, may form a capacitor having a first capacitive value C1 when the two appendages 101 and 201 are separated by the distance d1.

Figure 22:
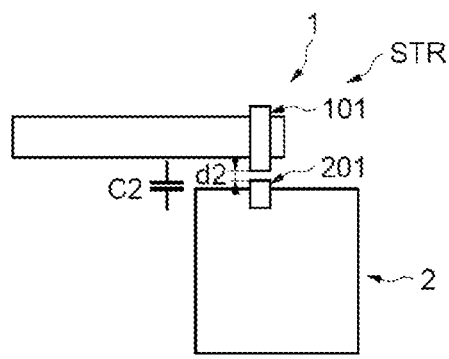

In a second configuration, illustrated in FIG. 22, the element 1 approaches the element 2 so that the distance d2 between the two appendages 101 and 201 is less than the distance d1, which gives the capacitor a second capacitive value C2 different from the capacitive value C1.

Furthermore, since the appendages 101 and 201 are formed by a compound resistant or refractory to the surface formation of an electrically insulating material, there is no risk of formation on the appendages of such an insulating material, which may form a parasitic dielectric and render incorrect the capacitive values C1 and C2 which have been calculated on the basis of the distances d1 and d2.

What is claimed is:

1. An integrated circuit, comprising:
a substrate;
an interconnection region overlying the substrate, the interconnection region having an insulating region and a plurality of metallization levels separated by via levels within the insulating region; and
a device within the interconnection region, the device having, in a housing filled with a fluid, two metal parts that are both located within the same metallization level and are mobile relative to one another in a plane parallel to the substrate, the device further comprising two electrically conductive appendages respectively secured to the two metal parts, each appendage being located partially at the same metallization level and partially at the via level immediately above the same metallization layer, each appendage having a projecting part facing towards the projecting part of the other appendage, each projecting part comprising an electrically conductive material that is resistant to formation of an electrically insulating compound at a surface in contact with the fluid.

2. The integrated circuit according to claim 1, wherein the electrically conductive material comprises an oxidation-resistant material.

3. The integrated circuit according to claim 1, wherein the electrically conductive material comprises a material selected from the group consisting of titanium, titanium nitride, tantalum, tantalum nitride, tungsten, ruthenium, and gold.

4. The integrated circuit according to claim 1, wherein the appendages and vias of the interconnect region are formed from the same material.

5. The integrated circuit according to claim 1, wherein the metallization levels comprise aluminum and wherein each appendage comprises tungsten coated with a barrier layer comprising titanium and titanium nitride.

6. The integrated circuit according to claim 1, wherein the metallization levels comprise copper and wherein each appendage comprises copper coated with a barrier layer comprising tantalum and tantalum nitride.

7. The integrated circuit according to claim 1, wherein the fluid comprises air.

8. The integrated circuit according to claim 1, wherein the device comprises a switch that is configurable into first and second configurations, wherein the two appendages are in contact in the first configuration so as to allow an electrical connection passing through the two appendages and the two metal parts, and wherein the two appendages are at a distance from one another in the second configuration so as to prevent the electrical connection.

9. The integrated circuit according to claim 8, wherein the device comprises a first metal element incorporating one of the two metal parts, a second metal element incorporating the other metal part, and a third element lying next to the first element, the first element and the third element respectively having two additional electrically conductive projecting appendages having a composition identical to that of the appendages lying next to one another.

10. The integrated circuit according to claim 9, wherein the device further includes an activation circuit configured in order to make the device change between the first and second configurations under the effect of an electrostatic force exerted between the two additional projecting appendages.

11. The integrated circuit according to claim 8, wherein the structure is thermally activatable.

12. The integrated circuit according to claim 1, wherein the device comprises a variable capacitor that is configurable into first and second configurations, wherein the two appendages are at a first distance from one another in the first configuration so as to form a first capacitor having a first capacitive value, and wherein the two appendages are at a second distance from one another in the second configuration so as to form a second capacitor having a second capacitive value.

13. The integrated circuit according to claim 12, wherein the device comprises a first metal element incorporating one of the two parts, a second metal element incorporating the other part, and a third element lying next to the first element, the first element and the third element respectively having two additional electrically conductive projecting appendages having a composition identical to that of the appendages lying next to one another.

14. The integrated circuit according to claim 13, wherein the device further includes an activation circuit configured in order to make the device change between the first and second configurations under the effect of an electrostatic force exerted between the two additional projecting appendages.

15. The integrated circuit according to claim 12, wherein the structure is thermally activatable.

16. An integrated circuit comprising:
a substrate;
a first metallization layer overlying the substrate;
a second metallization layer overlying the first metallization layer;
a via layer between the first metallization layer and the second metallization layer;
an interconnection comprising a first interconnect line formed in the first metallization layer, a second interconnect line formed in the second metallization layer and a via formed in the via layer, the via electrically connecting the first interconnect line to the second interconnect line; and
a device comprising a first metal part and a second metal part both of which are formed in the first metallization layer and are movable relative to one another in a plane parallel to a main surface of the substrate, the device further comprising a first electrically conductive appendage comprising a first portion of the via layer secured to the first metal part and a second electrically conductive appendage comprising a second portion of the via layer secured to the second metal part, the first appendage facing toward the second appendage, each appendage comprising a surface coated by an electrically conductive material that is resistant to formation of an electrically insulating compound.

17. The integrated circuit according to claim 16, wherein the electrically conductive material comprises an oxidation-resistant material.

18. The integrated circuit according to claim 16, wherein the first and second metallization layers comprise aluminum and wherein each appendage comprises tungsten coated with a barrier layer comprising titanium and titanium nitride.

19. The integrated circuit according to claim 16, wherein the first and second metallization layers comprise copper and wherein each appendage comprises copper coated with a barrier layer comprising tantalum and tantalum nitride.

20. The integrated circuit according to claim 16, wherein the device comprises a switch that is configurable into first and second configurations, wherein the first and second appendages are in contact in the first configuration so as to allow an electrical connection passing through the first and second appendages and the first and second metal parts, and wherein the first and second appendages are at a distance from one another the second configuration so as to prevent the electrical connection.

21. The integrated circuit according to claim 16, wherein the device comprises a variable capacitor that is configurable into first and second configurations, wherein the first and second appendages are at a first distance from one another in the first configuration so as to form a first capacitor having a first capacitive value, and wherein the first and second appendages are at a second distance from one another in the second configuration so as to form a second capacitor having a second capacitive value.

22. The integrated circuit according to claim 16, wherein the device is electrically activatable.

23. The integrated circuit according to claim 16, wherein the device is thermally activatable.

24. A switch formed in the back end of line of an integrated circuit, wherein the back end of line comprises a first metallization level, a second metallization level overlying the first metallization level, and a via level between the first metallization level and the second metallization level, the switch comprising:
a housing filled with air;
a first metal part formed in the first metallization level;
a second metal part formed in the first metallization level, wherein the first and second metal parts are movable relative to one another in a plane parallel to a plane of the first metallization level;
a first electrically conductive appendage comprising a first portion of the via level and being attached to the first metal part, a surface of the first appendage being coated with an oxide-resistant electrically conductive material;
a second electrically conductive appendage comprising a second portion of the via level and being attached to the second metal part, a surface of the second appendage being coated with the oxide-resistant electrically conductive material;
a third metal part adjacent the first metal part; and
an activation circuit electrically connected to the third metal part and configured to exert an electrostatic force on the first metal part so that the switch is configurable into first and second configurations, wherein the first and second appendages are in contact in the first configuration so as to allow an electrical connection passing through the first and second appendages and the first and second metal parts, and wherein the first and second appendages are at a distance from one another in the second configuration so as to prevent the electrical connection.

25. The switch according to claim 24, wherein the first and second metallization levels comprise aluminum and wherein the first and second appendages each comprise tungsten coated with a barrier layer comprising titanium and titanium nitride.

26. The switch according to claim 24, wherein first and second metallization levels comprise copper and wherein the first and second appendages each comprise copper coated with a barrier layer comprising tantalum and tantalum nitride.

* * * * *